United States Patent
Hirose

(10) Patent No.: US 10,842,055 B2
(45) Date of Patent: Nov. 17, 2020

(54) POWER CONVERTER AND MANUFACTURING METHOD OF THE SAME

(71) Applicant: TOYOTA JIDOSHA KABUSHIKI KAISHA, Toyota (JP)

(72) Inventor: Kentaro Hirose, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/737,302

(22) Filed: Jan. 8, 2020

(65) Prior Publication Data
US 2020/0245492 A1    Jul. 30, 2020

(30) Foreign Application Priority Data

Jan. 24, 2019 (JP) ................................. 2019-010534

(51) Int. Cl.
| | | |
|---|---|---|
| *H05K 7/20* | (2006.01) | |
| *H01R 25/16* | (2006.01) | |
| *H02M 7/537* | (2006.01) | |
| *H01L 23/46* | (2006.01) | |
| *H02M 7/00* | (2006.01) | |
| *H01R 43/02* | (2006.01) | |

(52) U.S. Cl.
CPC ............. *H05K 7/209* (2013.01); *H01L 23/46* (2013.01); *H01R 25/162* (2013.01); *H01R 43/0221* (2013.01); *H02M 7/003* (2013.01); *H02M 7/537* (2013.01)

(58) Field of Classification Search
None
See application file for complete search history.

(56) References Cited

U.S. PATENT DOCUMENTS

| | | | | |
|---|---|---|---|---|
| 6,843,335 | B2 * | 1/2005 | Shirakawa | B60L 50/51 180/65.1 |
| 9,474,191 | B2 * | 10/2016 | Higuma | H01L 21/4878 |
| 10,348,064 | B2 * | 7/2019 | Jung | H02B 1/56 |
| 2010/0327654 | A1 * | 12/2010 | Azuma | H01L 25/16 307/9.1 |
| 2011/0249421 | A1 * | 10/2011 | Matsuo | B60K 6/445 361/821 |

(Continued)

FOREIGN PATENT DOCUMENTS

| | | |
|---|---|---|
| JP | 2018-042309 A | 3/2018 |
| JP | 2018-073915 A | 5/2018 |

*Primary Examiner* — Courtney L Smith
(74) *Attorney, Agent, or Firm* — Oliff PLC

(57) ABSTRACT

A power converter may be provided with: a stacking unit including semiconductor modules interposed between adjacent coolers; a capacitor disposed next to the stacking unit; a first bus bar; a second bus bar; and an insulating plate. The insulating plate is interposed between the first bus bar and the second bus bar, and includes cylinder portions. Each of the cylinder portions passes through corresponding one of third holes of the second bus bar, and allows corresponding one of branch portions of the first bus bar and corresponding one of terminals of the semiconductor modules to pass therethrough. An emitting angle of laser beam that bonds each of the terminals and the corresponding one of the branch portions is adjusted such that reflected beam of laser reaches the corresponding one of the cylinder portions. The cylinder portions are colored in a color comprising a wavelength of the laser.

5 Claims, 5 Drawing Sheets

(56) References Cited

U.S. PATENT DOCUMENTS

2015/0003019 A1* 1/2015 Ide ..................... H01L 23/4334
                                                            361/705
2019/0280611 A1* 9/2019 Chung ................. H01L 25/072

* cited by examiner

POWER CONVERTER AND MANUFACTURING METHOD OF THE SAME

CROSS-REFERENCE TO RELATED APPLICATION

This application claims priority to Japanese Patent Application No. 2019-010534, filed on Jan. 24, 2019, the entire contents of which are incorporated herein by reference.

TECHNICAL FIELD

The technology disclosed herein relates to a power converter and a manufacturing method of the same. In particular, the technology relates to a power converter comprising a stacking unit in which a plurality of coolers is arranged side by side and a plurality of semiconductor modules is interposed between adjacent coolers.

BACKGROUND

Power converters including a stacking unit mentioned as above are described in Japanese Patent Application Publication No. 2018-042309 and Japanese Patent Application Publication No. 2018-073915, for example. The power converters in these literatures each include, besides the stacking unit, a capacitor, a first bus bar, a second bus bar, and an insulating plate. The capacitor is arranged next to the stacking unit. The first bus bar and the second bus bar are each a conductive member and each a plate shape. The first bus bar is connected to one of electrodes of the capacitor and bonded to first terminals each of which extends from one surface of a corresponding one of the plurality of semiconductor modules. The second bus bar is opposed to the first bus bar. The second bus bar is connected to another one of the electrodes of the capacitor and is bonded to second terminals each of which extends from the one surface of the corresponding one of the plurality of semiconductor modules. The insulating plate is interposed between the first bus bar and the second bus bar.

The first bus bar includes a plurality of first holes through each of which a corresponding one of the plurality of first terminals passes. The first bus bar includes first branch portions each of which extends from an edge of a corresponding one of the first holes, and is to be bonded to a corresponding one of the first terminals. The second bus bar is disposed opposite from the stacking unit with respect to the first bus bar, and includes a plurality of second holes through each of which a corresponding one of the second terminals passes. The second bus bar includes second branch portions each of which extends from an edge of a corresponding one of the second holes, and is to be bonded to the corresponding one of the second terminals. The second bus bar further includes a plurality of third holes through each of which the corresponding one of the first terminals and the corresponding one of the first branch portions pass. The insulating plate includes a plurality of cylinder portions through each of which the corresponding one of the first terminals and the corresponding one of the first branch portions pass. Each of the cylinder portions passes through the corresponding one of the third holes of the second bus bar. The insulating plate provided with the cylinder portions prevents a short circuit between the first bus bar and the second bus bar.

SUMMARY

In a stacking unit, semiconductor modules are arranged side by side in a stacking direction, thus it means that terminals (first and second terminals) of the semiconductor modules also are aligned in line. When an interval between the terminals is narrow, welding of the terminals and a bus bar tends to be difficult. Laser beam is suitable for welding in a narrow spot. There may however be a risk that reflected beam of laser beam from the first terminal or the first branch portion is irradiated inadvertently against the stacking unit and the stacking unit may be damaged. In the technology described in Japanese Patent Application Publication No. 2018-073915, tips of the first terminals and tips of the first branch portions are inclined. An emitting direction of the laser beam is adjusted so as to allow the reflected beam of the laser beam irradiated onto the tip of the first terminal or the first branch portion to be oriented in a direction separating away from the stacking unit. In the technology described in Japanese Patent Application Publication No. 2018-073915, however, the tips of the first terminals and the first branch portions need to be extended longer and inclined. The present disclosure provides an art capable of reducing damage incurred when reflected beam of laser beam is irradiated inadvertently to another component.

The present disclosure provides a power converter and a manufacturing method of the same. The power converter disclosed herein may comprise: a stacking unit comprising a plurality of coolers disposed side by side and a plurality of semiconductor modules interposed between adjacent coolers; a capacitor disposed next to the stacking unit and including a pair of electrodes; a first bus bar having a plate shape, connected to first terminals each extending from a surface of a corresponding one of the semiconductor modules, and connected to one electrode of the capacitor: a second bus bar having a plate shape, opposed to the first bus bar, connected to second terminals each extending from the surface of the corresponding one of the semiconductor modules, and connected to the other electrode of the capacitor; and an insulating plate having a plate shape, and interposed between the first bus bar and the second bus bar.

The first bus bar comprises a plurality of first holes and first branch portions, wherein each first terminal passes through a corresponding one of the first holes, each first branch portion extends from an edge of the corresponding one of the first holes, and is to be bonded to a corresponding one of the first terminals, the second bus bar is disposed opposite from the stacking unit with respect to the first bus bar, and comprising a plurality of second holes and second branch portions and a plurality of third holes, wherein each second terminal passes through a corresponding one of the second holes, each second branch portion extends from an edge of the corresponding one of the second holes and is to be bonded to a corresponding one of the second terminals, and each first terminal and first branch portion pass through a corresponding one of the third holes, and the insulating plate comprises a plurality of cylinder portions, wherein each first terminal and first branch portion pass through a corresponding one of the cylinder portions, and each cylinder portion passes through a corresponding one of the third holes of the second bus bar.

A manufacturing method of the power converter disclosed herein may comprise: bonding the first terminals and the first branch portions respectively by laser beam, wherein an emitting direction of the laser beam is adjusted so that reflected laser beam reflected from each of the first terminals or each of the first branch portions reaches the corresponding one of the cylinder portions, and a color of the cylinder portions comprises a wavelength of the laser beam. Since the color of the cylinder portions onto which the reflected beam is irradiated includes the wavelength of the laser, a majority of the reflected beam is reflected at a surface of the cylinder portion and only a remainder of the reflected beam is absorbed by the cylinder portion. Damage incurred by the reflected laser beam to the cylinder portion can be reduced. The color of the cylinder portions may be white. That is because white includes all wavelengths. The cylinder portions may be constituted of a same plastic material as a body of the insulating plate interposed between the first bus bar and the second bus bar and are integrally formed with the body of the insulating plate.

The power converter with the above-mentioned structure is suitable for welding of the first terminals and the first branch portions by laser beam. Details and further improvements of the art disclosed herein will be described in DETAILED DESCRIPTION.

DETAILED DESCRIPTION

Embodiment

Figure 1:
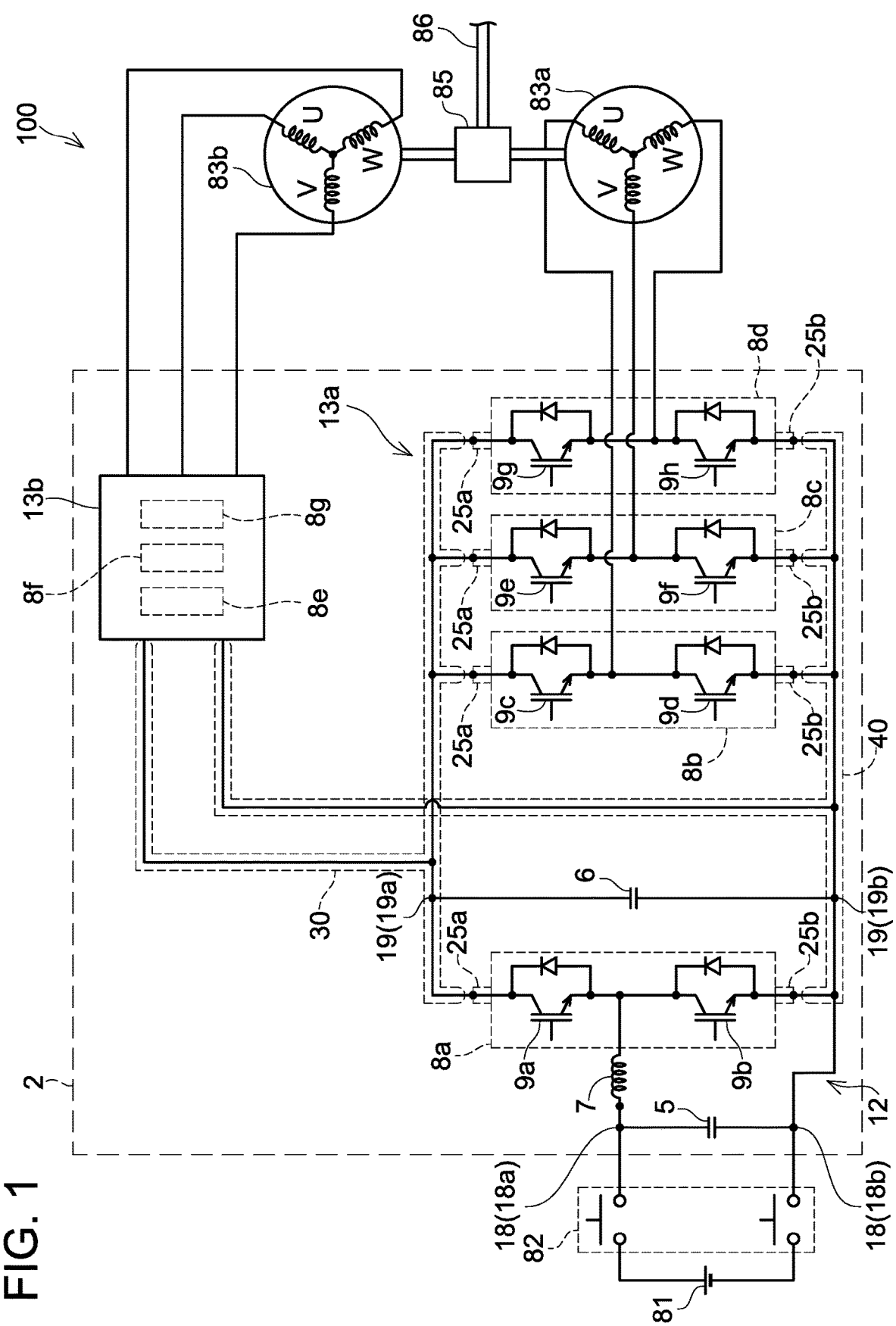
FIG. 1 illustrates a block diagram of a power system for an electrical vehicle, the system comprising a power converter according to an embodiment.

A power converter according to an embodiment will be described. The power converter according to the embodiment is a device mounted in an electric vehicle, and configured to convert power of a battery to a driving power of a traction motor. FIG. 1 illustrates a block diagram of a power system of an electric vehicle 100, the system comprising a power converter 2. The electric vehicle 100 includes two traction motors 83a, 83b. The power converter 2 therefore includes two sets of inverter circuits 13a, 13b. Output power of the two motors 83a, 83b is combined/distributed at a gear box 85, and transmitted to an axle shaft 86 (i.e. driving wheels).

The power converter 2 is connected to a battery 81 via a system main relay 82. The power converter 2 includes a voltage converter circuit 12 configured to step up a voltage of the battery 81, and the two sets of inverter circuits 13a, 13b configured to convert stepped-up DC power to AC.

The voltage converter circuit 12 is a bidirectional DC-DC converter configured to perform both of a step-up operation for stepping up a voltage applied to a battery-side terminal and outputting the same to an inverter-side terminal, and a step-down operation for stepping down a voltage applied to the inverter-side terminal and outputting the same to the battery-side terminal. For convenience of description, the battery-side (lower voltage side) terminal will be termed an input terminal 18, and the inverter-side (higher voltage side) terminal will be termed an output terminal 19. Further, a positive electrode and a negative electrode of the input terminal 18 will be termed an input positive electrode terminal 18a and an output negative electrode terminal 18b, respectively. A positive electrode and a negative electrode of the output terminal 19 will be termed an output positive electrode terminal 19a and an output negative electrode terminal 19b, respectively. The terms "input terminal 18" and the "output terminal 19" are for convenience for description, and as mentioned above, the voltage converter circuit 12 is the bidirectional DC-DC converter, and therefore there may be a case where current flows from the output terminal 19 to the input terminal 18.

The voltage converter circuit 12 is constituted of a serial circuit of two switching elements 9a, 9b, a reactor 7, a filter capacitor 5, and diodes each of which is connected in antiparallel to corresponding one of the switching elements. The reactor 7 has one end connected to the input positive electrode terminal 18a, and another end connected to a midpoint of the serial circuit. The filter capacitor 5 is connected between the input positive terminal 18a and the input negative electrode terminal 18b. The input negative electrode terminal 18b is directly connected to the output negative electrode terminal 19b. Since the voltage converter circuit 12 of FIG. 1 is well-known, and detailed description thereof will be omitted. A circuit in a range surrounded by a broken line rectangle denoted by sign 8a corresponds to a semiconductor module 8a to be described later. Signs 25a, 25b denote terminals extending from the semiconductor modules 8a. The sign 25a denotes the terminal (positive terminal 25a) electrically connected to a high potential side of the serial circuit of the switching elements 9a, 9b. The sign 25b denotes the terminal (negative terminal 25b) electrically connected to a low potential side of the serial circuit of the switching elements 9a, 9b. As will be described below, the terms "positive terminal 25a" and "negative terminal 25b" will also be used for other semiconductor modules.

An inverter circuit 13a has a configuration which includes three sets of serial circuits of two switching elements, and the three sets are connected in parallel. Each of a pair of switching elements 9c and 9d, a pair of switching elements 9e and 9f, and a pair of switching elements 9g and 9h constitutes a serial circuit. A diode is connected in antiparallel with each of the respective switching elements. The terminals (positive terminals 25a) on the high potential sides of the respective serial circuits in the three sets are connected to the output positive electrode terminal 19a of the voltage converter circuit 12, and the terminals (negative terminals 25b) on the low potential side of the respective serial circuits in the three sets are connected to the output negative electrode terminal 19b of the voltage converter circuit 12. Three phase AC current (U phase, V phase, W phase) is output from midpoints of the three sets of serial circuits. The respective three sets of serial circuits correspond to semiconductor modules 8b, 8c, 8d to be described later.

A configuration of an inverter circuit 13b is same as that of the inverter circuit 13a, and thus illustration of its specific circuit is omitted in FIG. 1. Similar to the inverter circuit 13a, the inverter circuit 13b also has the configuration which has three sets of serial circuits of two switching elements, and the three sets are connected in parallel. Terminals on the high potential sides of the serial circuits in the three sets are connected to the output positive electrode terminal 19a of the voltage converter circuit 12, and terminals on the low potential sides of the serial circuits in the three sets are connected to the output negative electrode terminal 19b of the voltage converter circuit 12. Hardware which corresponds to the respective serial circuits will be termed semiconductor modules 8e, 8f, 8g.

A smoothing capacitor 6 is connected in parallel to input terminals of the inverter circuits 13a, 13b. The smoothing capacitor 6 is configured to even out fluctuations in an output current of the voltage converter circuit 12.

Each of the switching elements 9a-9h is a transistor, and typically an Insulated Gate Bipolar Transistor (IGBT), and alternatively, may be another type of transistor, for example a Metal Oxide Semiconductor Field Effect Transistor (MOSFET). The switching element herein mentioned is implemented for power conversion, and sometimes referred to as a power semiconductor element.

In FIG. 1, each of broken lines 8a-8g corresponds to a semiconductor module. The power converter 2 comprises seven sets of serial circuits of two switching elements. As hardware, two switching elements constituting a serial circuit, and diodes each of which is connected to the corresponding one of the switching elements are incorporated in one package. Hereinbelow, the term "semiconductor module 8" is used to refer to one of the semiconductor modules 8a to 8g when they do not need to be distinguished.

Terminals (positive terminals 25a) on high potential sides of seven semiconductor modules (seven sets of serial circuits) are connected with a positive electrode of the smoothing capacitor 6, and terminals on low potential sides (negative terminals 25b) of the seven semiconductor modules are connected with a negative electrode of the smoothing capacitor 6. In FIG. 1, a current path in a broken line denoted by a sign 30 corresponds to a bus bar (positive bus bar) connecting the positive terminals 25a of the plurality of semiconductor modules 8 and the positive electrode of the smoothing capacitor 6 with each other. A current path in a broken line denoted by a sign 40 corresponds to a bus bar (negative bus bar) connecting the negative terminals 25b of the plurality of semiconductor modules 8 and the negative electrode of the smoothing capacitor 6 with each other. Next, how the plurality of semiconductor modules 8, the positive bus bar 30, and the negative bus bar 40 are configured will be described.

Figure 2:
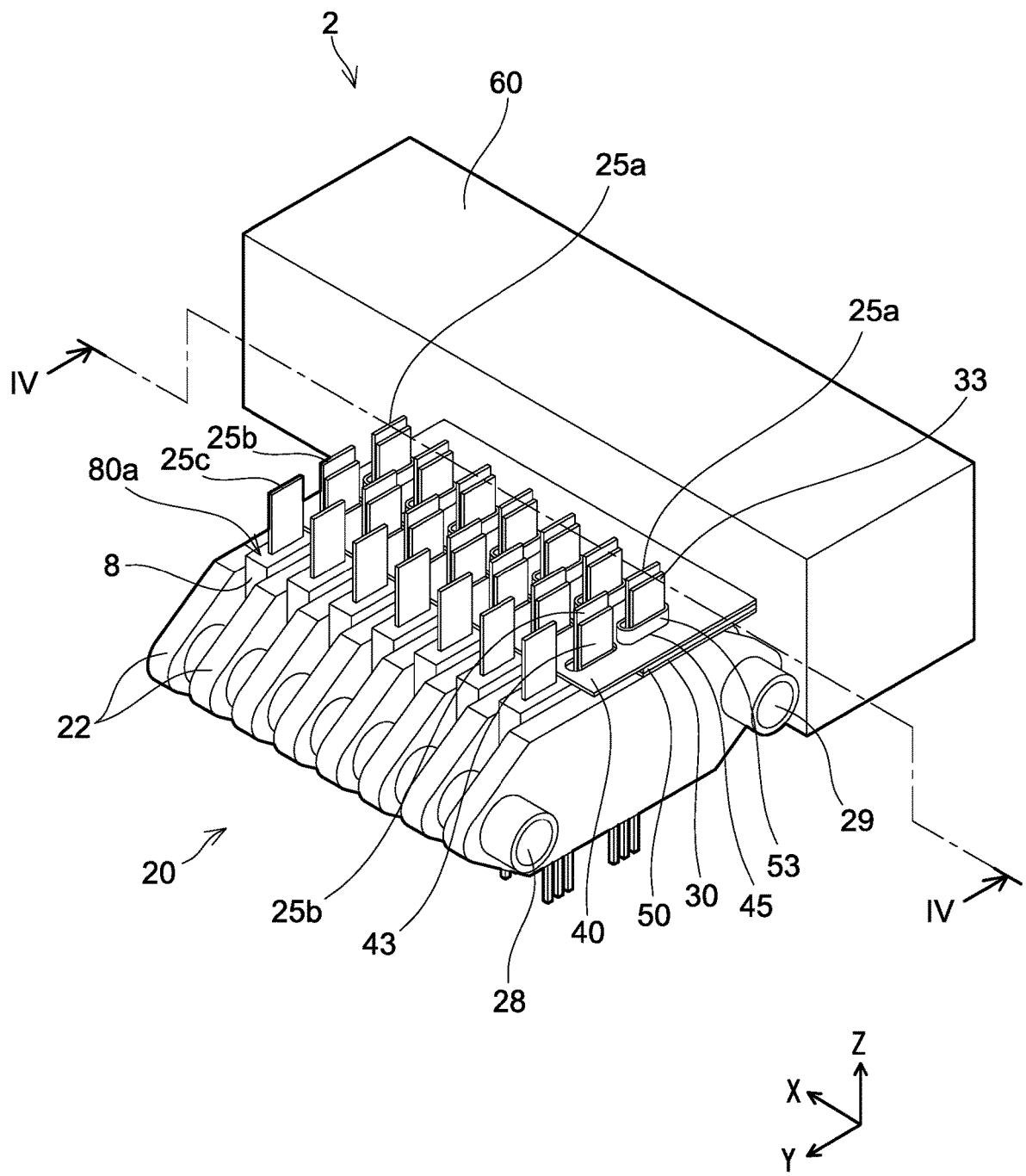
FIG. 2 illustrates a perspective view of an assembly of a stacking unit, bus bars, and a capacitor unit.

FIG. 2 shows a perspective view of hardware of the power converter 2. FIG. 2 omits illustration of a housing and some components of the power converter 2. The plurality of semiconductor modules 8 (8a-8g) as well as a plurality of coolers 22 constitute a stacking unit 20. Since the semiconductor modules 8a-8g have a same shape as one another, in FIG. 2 and FIG. 3 to be described later, a sign 8 is given only to the left-most semiconductor module as a representative thereof, and the sign is omitted from the other semiconductor modules. Further, in FIG. 2 and FIG. 3 to be described later, a sign 22 is given only to the two left-most coolers, and the sign is omitted from the other coolers.

Figure 3:
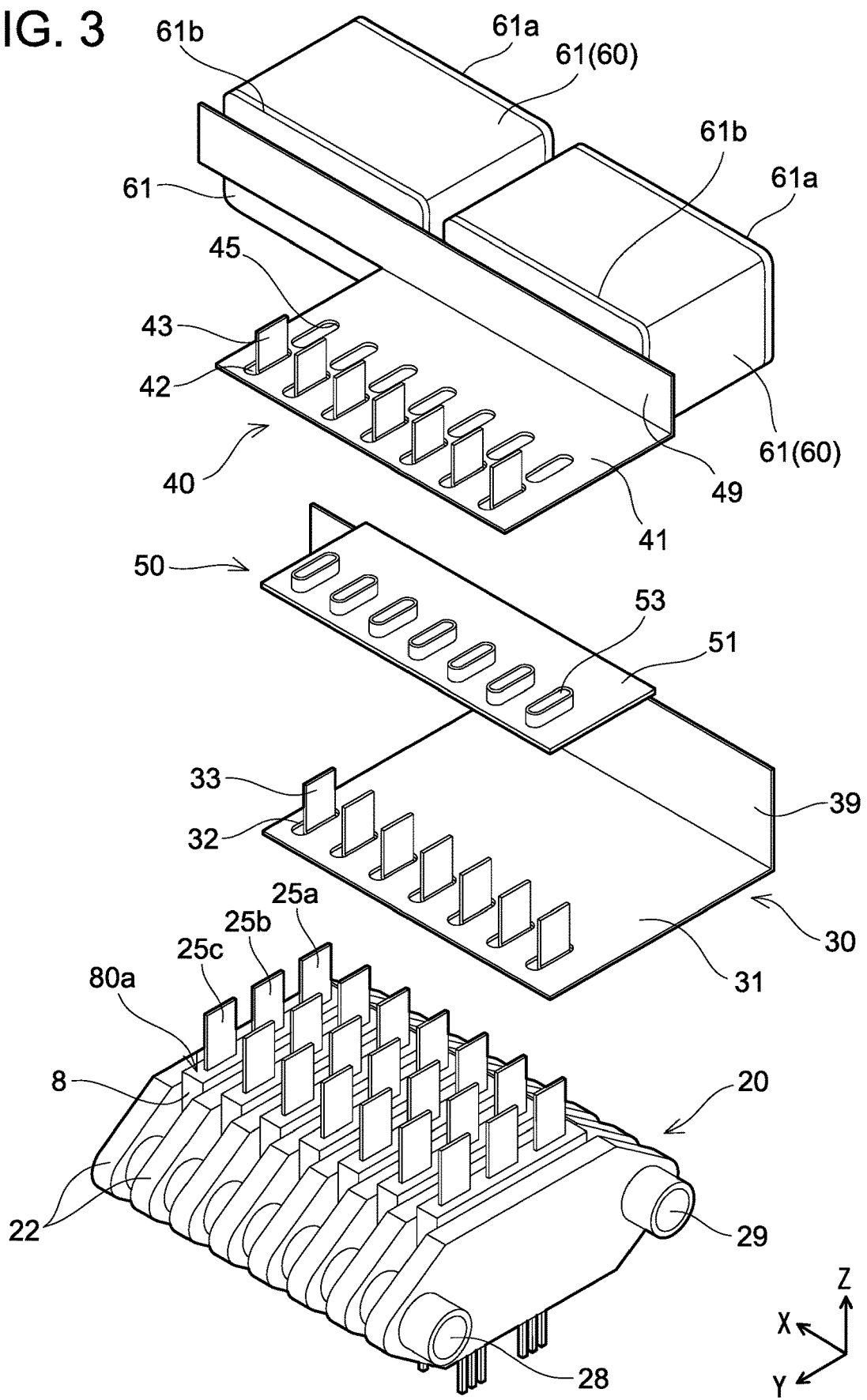
FIG. 3 illustrates an exploded perspective view of the stacking unit, the bus bars, and the capacitor unit.

FIG. 2 shows a perspective view of the power converter 2, however it only depicts an assembly of the stacking unit 20, the positive bus bar 30, the negative bus bar 40, and the capacitor 60, and illustration of the other components is omitted. The stacking unit 20 is a device in which the plurality of card-type coolers 22 are arranged in parallel to one another, and the adjacent coolers 22 have one card-type semiconductor module 8 interposed therebetween. Each of the card-type semiconductor modules 8 is stacked with its respective broad width planes facing the corresponding coolers 22. Three terminals (the positive terminal 25a, the negative terminal 25b, and a midpoint terminal 25c) extend from one side surface 80a of each semiconductor module 8. In FIGS. 2 and 3, the signs 25a, 25b and 25c are given only to the terminals of the semiconductor module 8 located on a left-most end of the stacking unit 20, and the signs indicative of the terminals are omitted from the other semiconductor modules 8.

Each positive terminal 25a and each negative terminal 25b are, as aforementioned, respectively the high-potential side terminal and the low potential side terminal of the serial circuits housed in a corresponding one of the semiconductor modules 8. Each midpoint terminal 25c is a terminal electrically in communication with a midpoint of the serial circuit. The three terminals 25a-25c extend in a positive Z axis direction from the one side surface 80a. The one side surface 80a crosses the broad width planes of the semiconductor module 8. A plurality of control terminals extends from a side surface opposite the one side surface 80a in a negative Z axis direction. The control terminals include a gate terminal electrically in communication with gate electrodes of the switching elements incorporated in the semiconductor module 8 and signal terminal(s) electrically in communication with a temperature sensor and/or a current sensor incorporated in the semiconductor module 8.

Hereinbelow, for the convenience of explanation, a stacking direction of the coolers 22 and the semiconductor modules 8 in the stacking unit 20 will be simply termed "the stacking direction." An X direction in a coordinate system in the drawings corresponds to the stacking direction.

The right-most cooler 22 in the drawings is provided with a coolant inlet 28 and a coolant outlet 29. Pairs of the adjacent coolers 22 are respectively connected by two connecting tubes. The connecting tubes on one side are positioned to overlap the coolant inlet 28 as seen along the stacking direction. The connecting tubes on the other side are positioned to overlap the coolant inlet 29 as seen along the stacking direction. The coolant inlet 28 and the coolant outlet 29 are connected to a coolant circulator not shown. The coolant supplied from the coolant inlet 28 is distributed to all the coolers 22 through the connecting tubes on the one side. While the coolant is passing through each cooler 22, the coolant absorbs heat from the adjacent semiconductor modules 8. The coolant that has absorbed the heat is drained out of the stacking unit 20 through the connecting tubes on the other side and the coolant outlet 29. Since each semiconductor module 8 is cooled from its both lateral sides, the stacking unit 20 has a high cooling performance for the semiconductor modules 8.

Each of the three terminals 25a-25c of each semiconductor module 8 is made of a metallic plate. The positive terminals 25a of the semiconductor modules 8 are aligned in one line such that each positive terminal 25a opposes a plate-like face of the positive terminal 25a of its adjacent semiconductor module 8. The negative terminals 25b of the semiconductor modules 8 are aligned in one line such that each negative terminal 25b opposes a plate-like face of the negative terminal 25b of its adjacent semiconductor module 8. The same arrangement applies to the midpoint terminals 25c of the semiconductor modules 8.

The capacitor 60 includes a plurality of capacitor elements 61 (see FIG. 3). The plurality of capacitor elements 61 is connected in parallel by the positive bus bar 30 and the negative bus bar 40 to be described later. The capacitor 60 (capacitor elements 61) is arranged next to the stacking unit 20. The capacitor elements 61 correspond to the smoothing capacitor 6 of FIG. 1.

FIG. 3 shows an exploded perspective view of an assembly of the positive bus bar 30, the negative bus bar 40, the stacking unit 20, and the capacitor 60 (capacitor elements 61). It should be noted that the capacitor 60 of FIG. 2 accommodates the two capacitor elements 61 therein. In FIG. 3, a case of the capacitor 60 is omitted and the capacitor elements 61 therein are depicted.

The positive terminals 25a of the semiconductor modules 8 and the positive electrodes 61a of the capacitor elements 61 are connected by the positive bus bar 30, and the negative terminals 25b of the semiconductor modules 8 and the negative electrodes 61b of the capacitor elements 61 are connected by the negative bus bar 40.

The positive bus bar 30 includes a plate-like electrode portion 39, a plate-like base portion 31, and a plurality of branch portions 33. The electrode portion 39 is connected to the positive electrodes 61a of the capacitor elements 61. The base portion 31 of the positive bus bar 30 has a plurality of first holes 32 formed therein, and each branch portion 33 extends from an edge of a corresponding one of the first holes 32 in a Z direction. Each positive terminal 25a of each semiconductor module 8 passes through a corresponding one of the first holes 32, and each positive terminal 25a and the corresponding branch portion 33 are bonded to each other.

The negative bus bar 40 includes a plate-like electrode portion 49, a plate-like base portion 41, and a plurality of branch portions 43. The electrode portion 49 is connected to the negative electrodes 61b of the capacitor elements 61. The base portion 41 of the negative bus bar 40 has a plurality of second holes 42 formed therein, and each branch portion 43 extends from an edge of a corresponding one of the second holes 42 in the Z direction. Each negative terminal 25b of each semiconductor module 8 passes through a corresponding one of the second holes 42, and each negative terminal 25b and the corresponding branch portion 43 are bonded to each other.

The negative bus bar 40 is located opposite from the stacking unit 20 with respect to the positive bus bar 30. The negative bus bar 40 has a plurality of third holes 45 formed therein, and each positive terminal 25a of each semiconductor module 8 and each branch portion 33 of the positive bus bar 30 pass through a corresponding one of the third holes 45. The plate-like base portion 31 of the positive bus bar 30 and the plate-like base portion 41 of the negative bus bar 40 are facing each other at a close distance.

A plate-like insulating plate 50 is interposed between the positive bus bar 30 and the negative bus bar 40. The insulating plate 50 insulates the positive bus bar 30 and the negative bus bar 40 from each other. A plate-like body 51 of the insulating plate 50 has a plurality of cylinder portions 53 formed thereon. Each cylinder portion 53 has a through hole formed therein, extending from a front side to a back side of the body 51. The body 51 of the insulating plate 50 and the cylinder portions 53 are constituted of a same plastic material. The body 51 and the cylinder portions 53 are formed integrally with an injection molding.

With the stacking unit 20, the positive bus bar 30, the negative bus bar 40, the insulating plate 50, and the capacitor 60 being assembled, outsides of the respective cylinder portions 53 fit into the corresponding ones of the third holes 45 of the negative bus bar 40. Further, each pair of the branch portion 33 and the positive terminal 25a passes through the corresponding one of the cylinder portions 53. That is, each cylinder portion 53 isolates the edge of the corresponding third hole 45 of the negative bus bar 40 and the corresponding pair of the branch portion 33 and positive terminal 25a from each other. A height of each cylinder portion 53 corresponds to a creeping distance between the corresponding branch portion 33 (positive terminal 25a) and the corresponding third hole 45 (see FIG. 2). The creeping distance is a distance between a positive conductor and a negative conductor and measured along a surface of an insulator that insulates the positive conductor and the negative conductor. A height of each cylinder portion 53 is determined in accordance with a desired creeping distance between the corresponding branch portion 33 (positive terminal 25a) and the edge of the corresponding third hole 45.

A manufacturing method of the power converter 2 will be described. In particular, bonding of the branch portions 33 of the positive bus bar 30 and the positive terminals 25a will be described. As shown in FIG. 2, the plurality of branch portions 33 is aligned in one line, thus intervals between adjacent branch portions 33 are narrow. Laser welding is suitable when welding of a branch portion 33 and a positive terminal 25a is conducted in such a limited space. If, however, reflected beam of laser irradiated onto the positive terminal 25a or the branch portion 33 reaches another component, this other component could be excessively heated. In the manufacturing method disclosed herein, an emitting direction of the laser is adjusted such that the reflected beam of the laser reaches a specific spot, and the spot which the reflected beam reaches is colored in a color comprising a wavelength of the laser or in white. Since the spot that is colored in the color comprising the wavelength of the laser or in white has better reflectivity of the laser (reflected beam), the spot is not excessively heated.

Figure 4:
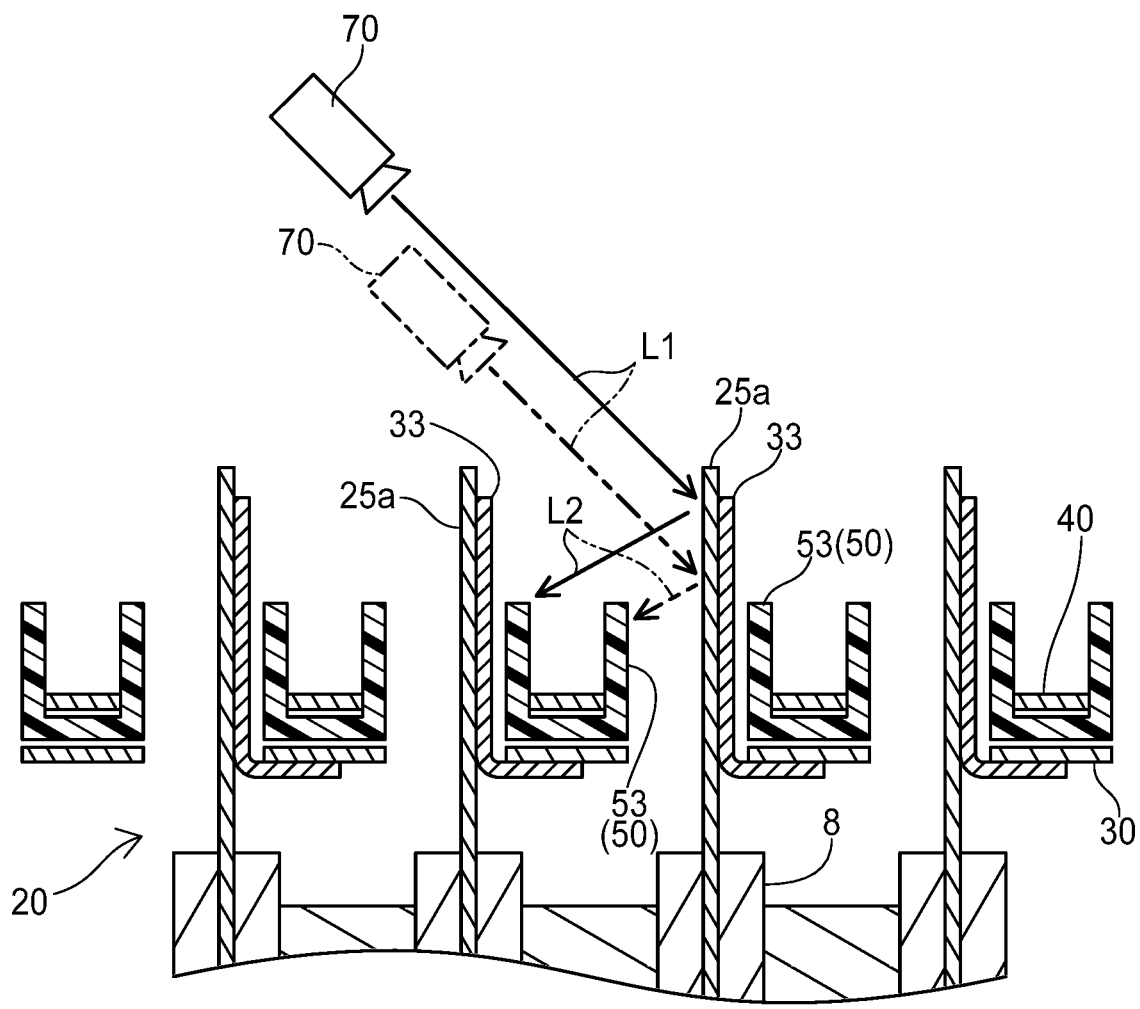
FIG. 4 illustrates a cross-sectional view along a IV-IV line in FIG. 2 (diagram for describing a manufacturing method according to an embodiment)

FIG. 4 shows a cross-sectional view of the stacking unit 20 along a IV-IV line of FIG. 2. FIG. 4 depicts a laser emitter 70 configured to respectively bond the branch portions 33 and the positive terminals 25a. In FIG. 4, laser is emitted from a positive terminal 25a side. Emitted laser beam L1 is irradiated onto a positive terminal 25a, and melts a part of the positive terminal 25a, by which the positive terminal 25a and its corresponding branch portion 33 (positive bus bar 33) are bonded to each other. A part of the emitted laser beam L1 is reflected by the positive terminal 25a. An angle of the laser emitter 70 (laser emitting direction) is adjusted such that reflected laser beam L2 reaches a corresponding cylinder portion 53 of the insulating plate 50. A color of the cylinder portions 53 is a color comprising a wavelength of the laser beam or white. In other words, the cylinder portions 53 are colored in a color that has excellent reflectivity of the laser beam. Due to this, the most of the reflected laser beam is not absorbed by the cylinder portions 53, thus the cylinder portions 53 are not excessively heated. A two-dot dashed line in FIG. 4 indicates that, even when the laser beam is irradiated onto another spot of the positive terminal 25a, the laser emitting direction is adjusted such that the reflected beam L2 reaches the corresponding cylinder portion 53.

Figure 5:
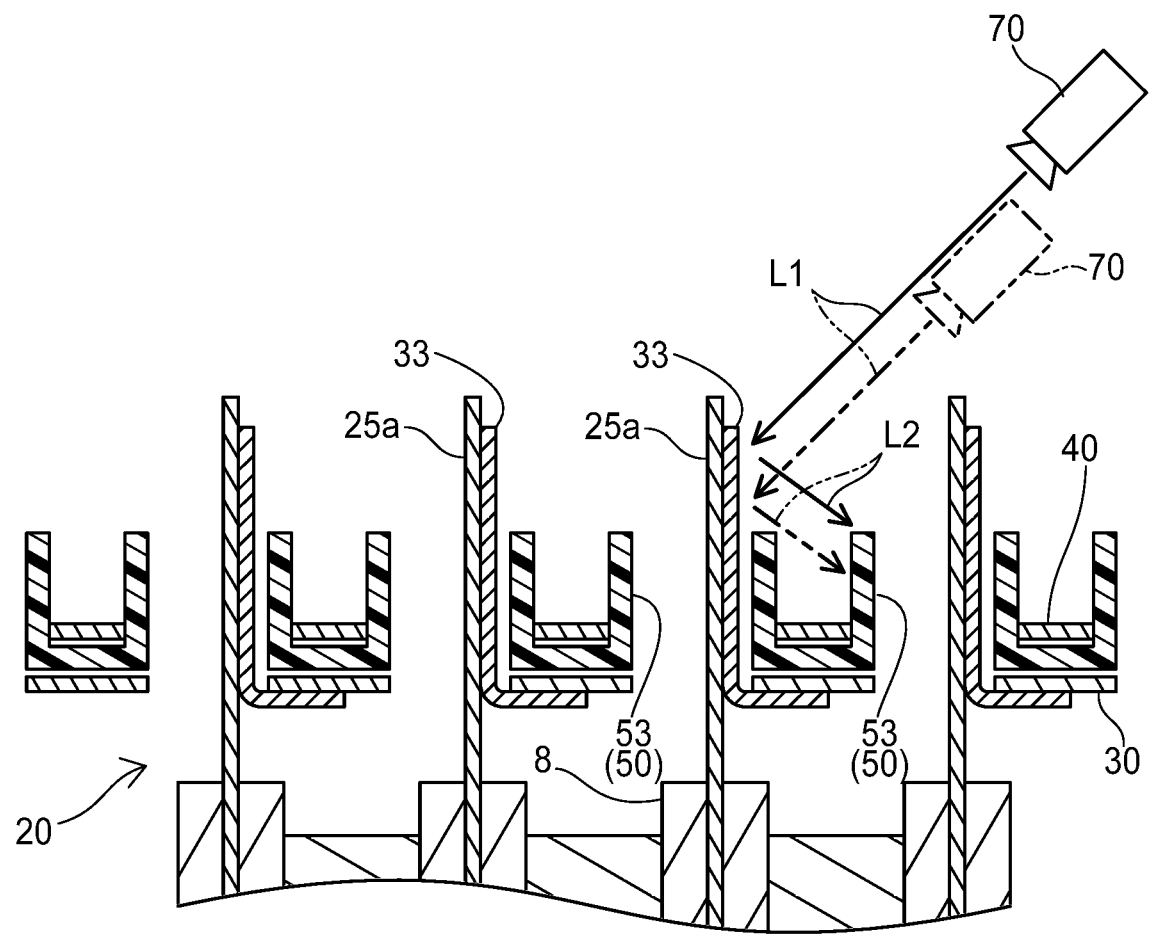
FIG. 5 illustrates a cross-sectional view along the IV-IV line in FIG. 2 (in which laser is irradiated from another direction).

FIG. 5 shows a cross-sectional view in a case where the laser beam is emitted from a branch portion 33 side. Also in the case where the laser is emitted from the branch portion 33 side, as shown in FIG. 5, the emitting direction of the laser L1 is adjusted such that the reflected laser beam L2 reaches the corresponding cylinder portion 53. A two-dot dashed line in FIG. 5 indicates that, even when the laser beam is irradiated onto another spot of the branch portion 33, the laser emitting direction is adjusted such that the reflected beam L2 reaches the corresponding cylinder portion 53.

Some of points to be noted in the art disclosed herein will be described. The positive bus bar 30 in the embodiment is an example of a first bus bar, and the negative bus bar 40 is an example of a second bus bar. The positive terminals 25a in the embodiment are an example of first terminals, and the negative terminals 25b in the embodiment are an example of second terminals. The branch portions 33 of the positive bus bar 30 in the embodiment are an example of first branch portions, and the branch portions 43 of the negative bus bar

40 are an example of second branch portions. "Positive" and "negative" in the embodiment may be interchanged.

While specific examples of the present disclosure have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present disclosure is not limited to the combinations described at the time the claims are filed. Further, the purpose of the examples illustrated by the present description or drawings is to satisfy multiple objectives simultaneously, and satisfying any one of those objectives gives technical utility to the present disclosure.

What is claimed is:

1. A manufacturing method of a power converter which comprises:
    a stacking unit comprising a plurality of coolers disposed side by side and a plurality of semiconductor modules interposed between adjacent coolers;
    a capacitor disposed next to the stacking unit and including a pair of electrodes;
    a first bus bar having a plate shape, connected to first terminals each extending from a surface of corresponding one of the semiconductor modules, and connected to one electrode of the capacitor:
    a second bus bar having a plate shape, opposed to the first bus bar, connected to second terminals each extending from the surface of the corresponding one of the semiconductor modules, and connected to the other electrode of the capacitor; and
    an insulating plate having a plate shape, and interposed between the first bus bar and the second bus bar,
    wherein
    the first bus bar comprises a plurality of first holes and first branch portions, wherein each first terminal passes through corresponding one of the first holes, each first branch portion extends from an edge of the corresponding one of the first holes, and is to be bonded to corresponding one of the first terminals,
    the second bus bar disposed opposite from the stacking unit with respect to the first bus bar, and comprising a plurality of second holes and second branch portions and a plurality of third holes, wherein each second terminal passes through corresponding one of the second holes, each second branch portion extends from an edge of the corresponding one of the second holes and is to be bonded to corresponding one of the second terminals, and each first terminal and first branch portion pass through corresponding one of the third holes, and
    the insulating plate comprises a plurality of cylinder portions, wherein each first terminal and first branch portion pass through corresponding one of the cylinder portions, and each cylinder portion passes through corresponding one of the third holes of the second bus bar,
    the manufacturing method comprising:
    bonding the first terminals and the first branch portions respectively by laser beam,
    wherein an emitting direction of the laser beam is adjusted so that reflected laser beam reflected from each of the first terminals or each of the first branch portions reaches the corresponding one of the cylinder portions, and
    a color of the cylinder portions comprises a wavelength of the laser beam.

2. The manufacturing method of claim 1, wherein the color of the cylinder portions is white.

3. The manufacturing method of claim 1, wherein the cylinder portions are constituted of a same plastic material as a body of the insulating plate interposed between the first bus bar and the second bus bar and are integrally formed with the body of the insulating plate.

4. A power converter comprising:
    a stacking unit comprising a plurality of coolers disposed side by side and a plurality of semiconductor modules interposed between adjacent coolers;
    a capacitor disposed next to the stacking unit and including a pair of electrodes;
    a first bus bar having a plate shape, connected to first terminals each extending from a surface of corresponding one of the semiconductor modules, and connected to one electrode of the capacitor;
    a second bus bar having a plate shape, opposed to the first bus bar, connected to second terminals each extending from the surface of the corresponding one of the semiconductor modules, and connected to the other electrode of the capacitor; and
    an insulating plate having a plate shape, and interposed between the first bus bar and the second bus bar,
    wherein
    the first bus bar comprises a plurality of first holes and first branch portions, wherein each first terminal passes through corresponding one of the first holes, each first branch portion extends from an edge of the corresponding one of the first holes, and is to be bonded to corresponding one of the first terminals,
    the second bus bar disposed opposite from the stacking unit with respect to the first bus bar, and comprising a plurality of second holes and second branch portions and a plurality of third holes, wherein each second terminal passes through corresponding one of the second holes, each second branch portion extends from an edge of the corresponding one of the second holes and is to be bonded to corresponding one of the second terminals, and each first terminal and first branch portion pass through corresponding one of the third holes, and
    the insulating plate comprises a plurality of white cylinder portions, wherein each first terminal and first branch portion pass through corresponding one of the cylinder portions, and each cylinder portion passes through corresponding one of the third holes of the second bus bar.

5. The power converter of claim 4, wherein the cylinder portions are constituted of a same plastic material as a body of the insulating plate interposed between the first bus bar and the second bus bar and are integrally formed with the body of the insulating plate.

* * * * *